(12) United States Patent
Marrow et al.

(10) Patent No.: US 9,337,873 B2
(45) Date of Patent: May 10, 2016

(54) MISCORRECTION DETECTION FOR ERROR CORRECTING CODES USING BIT RELIABILITIES

(71) Applicant: SK Hynix Inc., Gyeonggi-do (KR)

(72) Inventors: Marcus Marrow, San Jose, CA (US); Jason Bellorado, San Jose, CA (US); Zheng Wu, San Jose, CA (US); Naveen Kumar, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 125 days.

(21) Appl. No.: 14/265,249

(22) Filed: Apr. 29, 2014

(65) Prior Publication Data

US 2014/0351672 A1    Nov. 27, 2014

Related U.S. Application Data

(60) Provisional application No. 61/827,428, filed on May 24, 2013, provisional application No. 61/857,629, filed on Jul. 23, 2013.

(51) Int. Cl.
| | |
|---|---|
| *H04L 1/00* | (2006.01) |
| *H03M 13/45* | (2006.01) |
| *H03M 13/15* | (2006.01) |
| *H03M 13/37* | (2006.01) |
| *G06F 11/10* | (2006.01) |
| *H03M 13/29* | (2006.01) |

(52) U.S. Cl.
CPC ......... *H03M 13/453* (2013.01); *G06F 11/1012* (2013.01); *H03M 13/152* (2013.01); *H03M 13/2975* (2013.01); *H03M 13/3738* (2013.01); *H03M 13/3784* (2013.01); *H03M 13/2963* (2013.01)

(58) Field of Classification Search
CPC .................................................... H04L 1/0057
USPC .................... 714/764, 758, 755, 780, 792
See application file for complete search history.

(56) References Cited

U.S. PATENT DOCUMENTS

| | | | | |
|---|---|---|---|---|
| 5,222,069 | A * | 6/1993 | Chevalley | H04N 9/888 386/E9.059 |
| 8,209,590 | B2 | 6/2012 | Shen et al. | |
| 8,713,413 | B1 * | 4/2014 | Bellorado | H03M 13/336 714/760 |
| 2006/0156171 | A1 | 7/2006 | Kuznetsov et al. | |
| 2008/0148129 | A1 | 6/2008 | Moon et al. | |
| 2008/0201625 | A1 * | 8/2008 | Mulligan | G06F 11/1068 714/758 |
| 2011/0214039 | A1 | 9/2011 | Steiner et al. | |
| 2012/0005560 | A1 * | 1/2012 | Steiner | H03M 13/09 714/780 |

FOREIGN PATENT DOCUMENTS

| | | |
|---|---|---|
| TW | 200519595 A | 6/2005 |
| TW | 200821909 | 5/2008 |

OTHER PUBLICATIONS

International Preliminary Report on Patentability issued by the World Intellectual Property Organization on Dec. 3, 2015.

* cited by examiner

*Primary Examiner* — Fritz Alphonse
(74) *Attorney, Agent, or Firm* — IP & T Group LLP

(57) ABSTRACT

Miscorrection detection for error correction codes using bit reliabilities includes receiving a plurality of reliabilities corresponding to respective ones of a plurality of read values, receiving one or more proposed corrections corresponding to one or more of the plurality of read values, and determining a miscorrection metric based at least in part on one or more of the plurality of reliabilities corresponding to the one or more of the plurality of read values.

21 Claims, 11 Drawing Sheets

FIG. 9

MISCORRECTION DETECTION FOR ERROR CORRECTING CODES USING BIT RELIABILITIES

CROSS REFERENCE TO OTHER APPLICATIONS

This application claims priority to U.S. Provisional Patent Application No. 61/827,428 entitled MISCORRECTION DETECTION FOR ERROR CORRECTING CODES USING BIT RELIABILITIES filed May 24, 2013 which is incorporated herein by reference for all purposes and U.S. Provisional Patent Application No. 61/857,629 entitled SOFT INPUT HARD OUTPUT (SIHO) DECODING FOR MULTI-LEVEL TURBO PRODUCT CODES (TPC) filed Jul. 23, 2013 which is incorporated herein by reference for all purposes.

BACKGROUND OF THE INVENTION

Error correcting codes such as BCH codes, Reed-Solomon codes, and Hamming codes, for example, are widely used in various fields of storage and communications. During decoding of error correcting code, the decoder will usually report the received word to be uncorrectable or correctable. However, when a decoder claims the received word to be correctable, there is a possibility that the decoder mistakenly decoded to another codeword which is different from the transmitted codeword. This is referred to as a miscorrection.

BRIEF DESCRIPTION OF THE DRAWINGS

Various embodiments of the invention are disclosed in the following detailed description and the accompanying drawings.

FIG. 9 shows a set of hard decisions and a corresponding set of reliabilities associated with a codeword and the identified m bits in Chase decoding.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
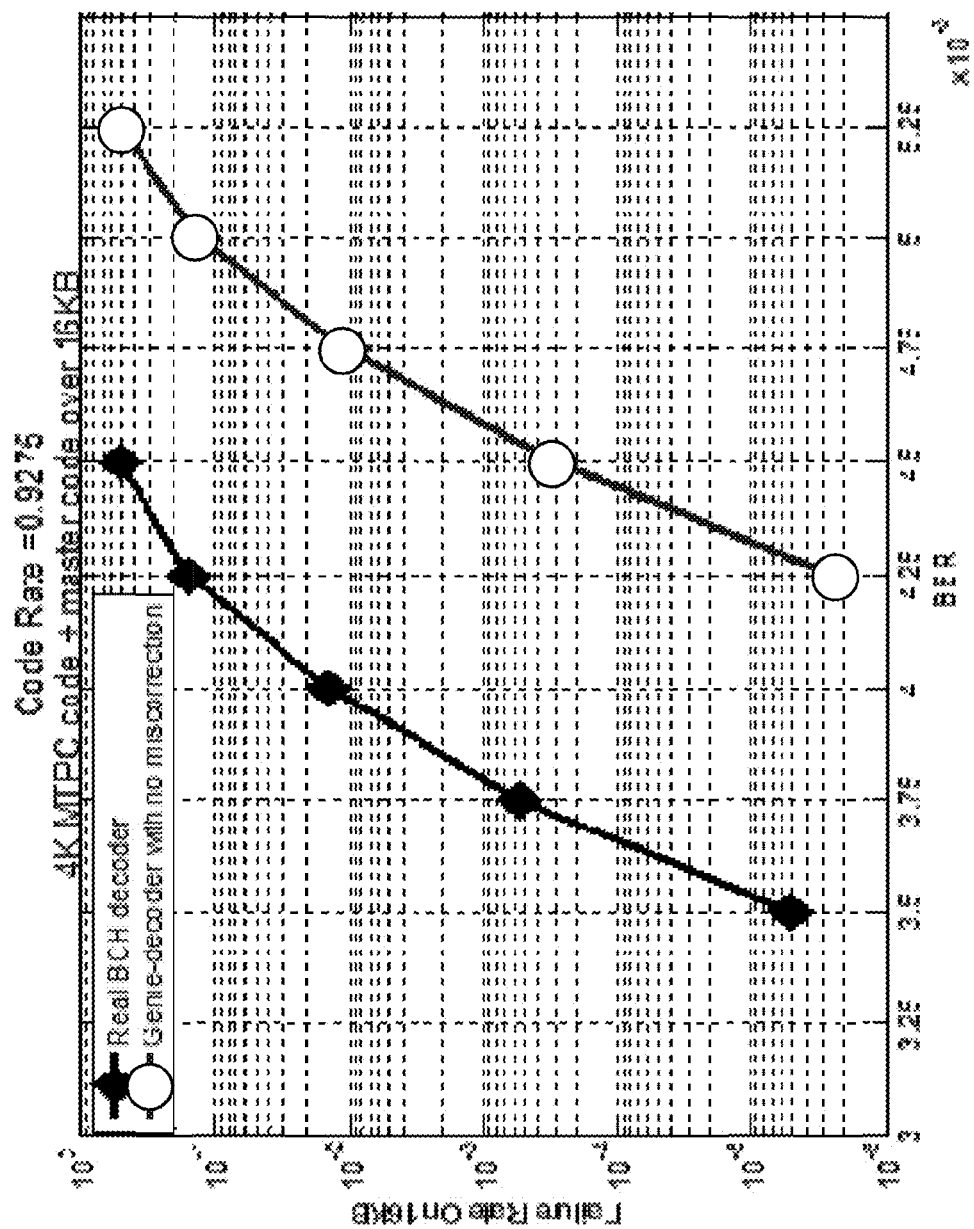
FIG. 1 is an example showing the failure rate curve of a multi-level Turbo Product Code (MTPC) with master code (MTPC+master) with a constituent code as BCH code of small T (T=3 for row and column code, T=2 for master code).

FIG. 1 is an example showing the failure rate curve of a multi-level Turbo Product Code (MTPC) with master code (MTPC+master) with a constituent code as BCH code of small T (T=3 for row and column code, T=2 for master code). The performance curve on the left is the simulation result of a real BCH decoder, in which miscorrection for constituent BCH code will happen, and the performance curve on the right is using a genie decoder, where miscorrection is removed by comparing to the genie data (i.e., effectively no miscorrection of the constituent codes occur). In various embodiments, "genie data" refers to simulated data that is the same as the transmitted codewords that can be used by a genie decoder to decode read signals with minimal or no miscorrections. As shown in FIG. 1, there is a performance gap between the two curves.

The miscorrection problem is not easy to solve. In some conventional systems, parity check bits are added in addition to the parity generated by the code, to detect a miscorrection in a correctable codeword output by a decoder. For example, cyclic redundancy checks (CRC) can be added to the user data portion and together with the user data, are protected by the main code. After decoding, CRC are further checked. If the check fails, a miscorrection is detected. Another conventional example is adding one or two single parity checks to the codeword. Similarly to the CRC check, if the decoded codeword does not satisfy the parity checks, miscorrection is detected. However, the disadvantage of these conventional techniques is the cost of extra overhead. In some overhead sensitive applications, these conventional techniques cannot be used. Since such a small amount of overhead is used for each constituent code in a Turbo Product Code (TPC) system (i.e., a small value of T is used), such approaches cannot be used here.

Embodiments of miscorrection detection using reliability information are described herein. In various embodiments, miscorrection detection is performed without adding extra parity bits to the user data to be encoded. In various embodiments, encoded codewords that have been written to a medium (e.g., hard disk or flash) are processed into sets of hard decisions. Each "hard decision" is a bit that comprises a "0" or "1" value and is associated with a particular location within the length of the codeword. A "hard decision" may also be referred to as a "hard output" or "hard information." In various embodiments, the reliability of each hard decision is known. The "reliability" of a hard decision refers to a probability (a value from "0" through "1") that the corresponding hard decision is correct. A "reliability" may also be referred to as "soft information" or a "soft output." As will be described in further detail below, reliabilities can be used to detect miscorrection. For example, in a NAND channel, a reliability for each bit is obtained by multiple reads using different thresholds.

In various embodiments, a plurality of read values corresponding to a codeword is received. For example, the plurality of read values corresponding to a codeword to be decoded comprises the hard decisions corresponding to the codeword. A plurality of reliabilities corresponding to respective ones of the plurality of read values is received. For example, the plurality of reliabilities comprises the corresponding soft information to each of the hard decisions corresponding to the codeword. One or more proposed corrections corresponding to one or more of the plurality of read values are received. For example, the proposed corrections comprise proposed bit flips to certain locations (bits) of the hard decisions. For example, the proposed corrections are received from either a hard decision decoder or a soft decision decoder, as will be described in further detail below. A miscorrection metric is determined based on those of the plurality of reliabilities that correspond to the one or more plurality of read values associated with the locations of the proposed corrections. In some embodiments, whether the proposed corrections are to be applied to the plurality of read values is based on comparing the determined miscorrection metric to a miscorrection threshold. By comparing the miscorrection metric to a threshold, it can be determined whether it is appropriate to prevent application of the proposed corrections to the plurality of read values to potentially avoid outputting a correctable codeword that is actually a miscorrection, as will be described in further detail below.

In the past, TPCs have been extensively used in wireless communications for their significant performance improvement with low encoding/decoding complexity. Similarly, NAND-based storage devices demand for an error correction coding (ECC) scheme which can provide high performance gains with low implementation complexity. As such, TPC is a viable option for NAND flash applications. In some instances, TPC arranges encoded data in logical rows and columns. As such, during decoding, the read data segment of each row (or column) is decoded and then each column (or row) is decoded to increase the success of decoding a read data segment in a subsequent iteration of decoding. Decoding may iteratively and repeatedly process the rows and columns of data read segments to output as many correctable codewords as possible. If the hard decision decoding fails, multiple reads can be done to get the soft information for bits. This soft information can be used to decode the failed page. Even using the soft information in the TPC decoder is not straightforward and has not been fully investigated in the past. In some embodiments, miscorrection detection can be used with decoding codewords associated with TPC.

Figure 2:
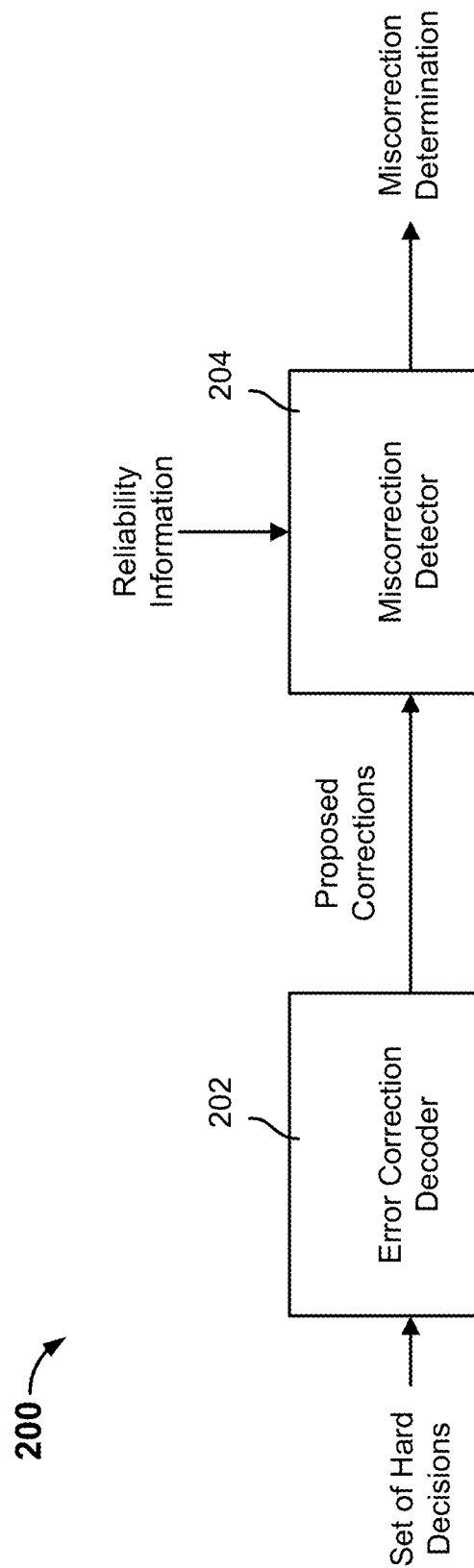
FIG. 2 is a diagram showing a system for miscorrection detection for error correcting codes using reliability information.

FIG. 2 is a diagram showing a system for miscorrection detection for error correcting codes using reliability information. In the sample, system 200 includes error correction decoder 202 and miscorrection detector 204. Either one or both of error correction decoder 202 and miscorrection detector 204 can be implemented with or by a semiconductor device, such as a field-programmable gate array (FPGA) or an application-specific integrated circuit (ASIC).

In some embodiments, error correction decoder 202 comprises a constituent decoder. For example, error correction decoder 202 can be one of the constituent (i.e., row or column) decoder(s) associated with TPC decoding. For example, error correction decoder 202 comprises a BCH decoder. Error correction decoder 202 is configured to receive as an input a set of hard decisions corresponding to a codeword (e.g., encoded with a constituent code). In various embodiments, a set of hard decisions corresponds to a codeword that is currently being decoded. For example, the set of hard decisions can be received from a memory or read from a medium. The set of hard decisions comprises a series of bits. In the event that error correction decoder 202 determines that the input set of hard decisions is correctable, error correction decoder 202 outputs one or more proposed corrections to the input set of hard decisions. If the proposed one or more corrections are applied to the set of hard decisions, then the modified set of hard decisions would comprise a correctable codeword (or sometimes referred to as a "decoded codeword").

The proposed corrections comprise proposed bit flips, where each proposed bit flip corresponds to a location within the set of hard decisions whose value ("0" or "1") is proposed by error correction decoder 202 to be flipped. For example, assume that a proposed bit flip were associated with a location within the input set of hard decisions that is associated with a value of "1." If the proposed bit flip were applied to the value at that location, the value of that location would be changed to "0." Conversely, assume that a proposed bit flip were associated with a location within the input set of hard decisions that is associated with a value of "0." If the proposed bit flip were applied to the value at that location, the value of that location would be changed to "1." In some embodiments, the number of proposed corrections output by error correction decoder 202 is limited by a parameter associated with the type of code used (e.g., the number of proposed corrections output by error correction decoder 202 is limited to T for BCH codes) and/or the type of decoder associated with error correction decoder 202.

In some embodiments, error correction decoder 202 can be a hard decision decoder or a soft decision decoder. In some embodiments, if error correction decoder 202 comprises a soft decision decoder (e.g., a Chase decoder) then, in addition to the input of the set of hard decisions, error correction decoder 202 would also receive a set of reliabilities (not shown in the diagram) corresponding to the set of hard decisions as an input. Examples of using miscorrection detection with Chase decoding are described in detail further below. Regardless of whether error correction decoder 202 comprises a hard decision decoder or a soft decision decoder, error correction decoder 202 outputs at least one or more proposed corrections to an input set of hard decisions that error correction decoder 202 determines to be correctable.

While application of the proposed corrections output by error correction decoder 202 to the set of hard decisions may result in a correctable codeword, the resulting codeword may be a different codeword than the transmitted codeword. Put another way, in some instances, the application of proposed corrections output by error correction decoder 202 may lead to miscorrections. As will be described below, the proposed corrections output by error correction decoder 202 may be prevented from being applied to the set of the hard decisions in the event that miscorrection detector 204 determines that the proposed corrections to the set of hard decisions could lead to a miscorrection.

Miscorrection detector 204 is configured to determine a miscorrection metric corresponding to a correctable codeword (e.g., encoded with a constituent code) determined by error correction decoder 202. The correctable codeword is the result of applying the corrections proposed by error correction decoder 202 to the input set of hard decisions. Miscorrection detector 204 is configured to determine the miscorrection metric based on an input set of reliabilities that corresponds to the set of hard decisions input to error correction decoder 202. Then, miscorrection detector 204 is configured to use the determined miscorrection metric to determine whether it is appropriate to apply the proposed corrections output by error correction decoder 202 to the set of hard decisions to yield the correctable codeword. In various embodiments, miscorrection detector 204 identifies the reliabilities of the set of reliabilities that correspond to those locations of the set of hard decisions that have been proposed to be corrected by error correction decoder 202 to yield the correctable codeword. Miscorrection detector 204 determines the miscorrection metric based on combining the identified reliabilities of the set of reliabilities that correspond to those locations of the set of hard decisions that have been proposed to be corrected. Miscorrection detector 204 is configured to use this miscorrection metric to determine whether the proposed corrections to the set of hard decisions will likely result in a correct correctable codeword or a miscorrected correctable codeword. Because allowing a miscorrected correctable codeword to be output may create subsequent decoding failures or errors, in the event that miscorrection detector 204 determines that the proposed corrections to the set of hard decisions will likely result in a miscorrected correctable codeword, miscorrection detector 204 is configured to prevent the proposed corrections from being applied/committed to the set of hard decisions and to cause an uncorrectable status of the codeword to be output. Even though an uncorrectable status of the codeword is output, it is assumed that a miscorrection was potentially avoided, which may lower the overall failure rate of decoding. Otherwise, in the event that miscorrection detector 204 determines that the proposed corrections to the set of hard decisions will likely not result in a miscorrected correctable codeword, miscorrection detector 204 is configured to allow the proposed corrections to be applied to the set of hard decisions and to cause the correctable codeword to be output.

In some embodiments, miscorrection detector 204 is configured to determine whether it is appropriate to apply the proposed corrections output by error correction decoder 202 to the set of hard decisions based on comparing the miscorrection metric to a miscorrection threshold. For example, the miscorrection threshold can be configured by a system administrator. In some embodiments, the value of the miscorrection threshold can be adjusted in response to one or more events. For example, the value of the miscorrection threshold can be adjusted to decrease as the number decoding iterations increases or to increase as the current signal-to-noise (SNR) ratio increases. In some embodiments, if miscorrection detector 204 determines that the miscorrection metric is less than or equal to the miscorrection threshold, then the proposed corrections are allowed to be applied to the set of hard decisions and the correctable codeword is caused to be output. Otherwise, if miscorrection detector 204 determines that the miscorrection metric is greater than the miscorrection threshold, then the proposed corrections are prevented from being applied to the set of hard decisions and an uncorrectable status of the codeword is caused to be output.

As such, miscorrection detector 204 can be added to and/or combined with a decoder to lower the miscorrection rate.

Figure 3:
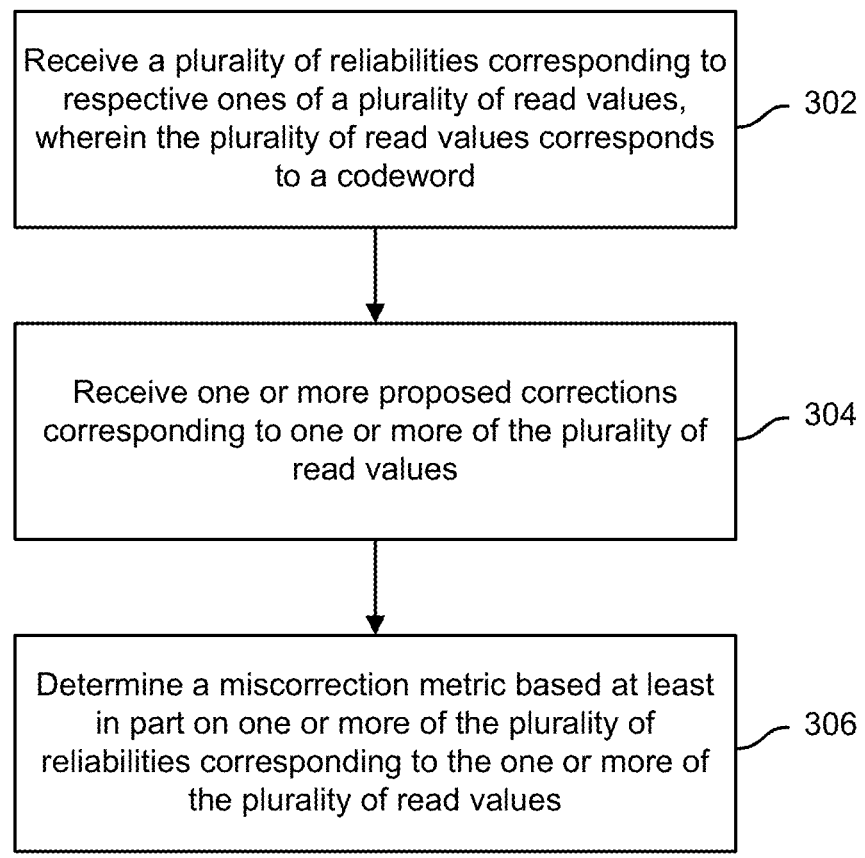
FIG. 3 is a flow diagram showing an embodiment of a process for determining a miscorrection metric using reliability information.

FIG. 3 is a flow diagram showing an embodiment of a process for determining a miscorrection metric using reliability information. In some embodiments, process 300 is performed by a read controller associated with a storage controller (e.g., a NAND Flash controller). In some embodiments, process 300 is performed by a semiconductor device, such as a field-programmable gate array (FPGA) or an application-specific integrated circuit (ASIC). In some embodiments, process 300 is implemented at a system such as system 200 of FIG. 2.

At 302, a plurality of reliabilities corresponding to respective ones of a plurality of read values is received, wherein the plurality of read values corresponds to a codeword. In various embodiments, the plurality of read values comprises a set of hard decisions (e.g., a series of bits) corresponding to a codeword (e.g., encoded with a constituent code) to be decoded. A set of reliabilities (soft information) is received, where each reliability comprises a probability that corresponds to a particular bit location in the set of hard decisions.

At 304, one or more proposed corrections corresponding to one or more of the plurality of read values are received. In various embodiments, an error correction decoder determined that the set of hard decisions is correctable and therefore proposed one or more corrections to the set of hard decisions. If the proposed corrections are applied to the set of hard decisions, a correctable codeword (e.g., a decoded codeword) can be output. In some embodiments, the decoder can be a hard decision decoder or a soft decision decoder. Each proposed correction comprises a proposed bit flip to a particular bit location in the set of hard decisions. In some embodiments, the decoder comprises a constituent decoder.

At 306, a miscorrection metric is determined based at least in part on one or more of the plurality of reliabilities corresponding to the one or more of the plurality of read values. In various embodiments, the miscorrection metric is determined by combining the reliabilities corresponding to the locations of the set of hard decisions associated with the proposed corrections. For example, combining the reliabilities corresponding to the locations of the set of hard decisions associated with the proposed corrections can be adding together the absolute value of each of the reliabilities corresponding to the locations of the set of hard decisions associated with the proposed corrections. In some embodiments, the miscorrection metric is compared to a miscorrection threshold to determine whether the proposed corrections should be applied to the set of hard decisions to yield the correctable codeword or should not be applied to the set of hard decisions to yield an uncorrectable codeword status.

Figure 4:
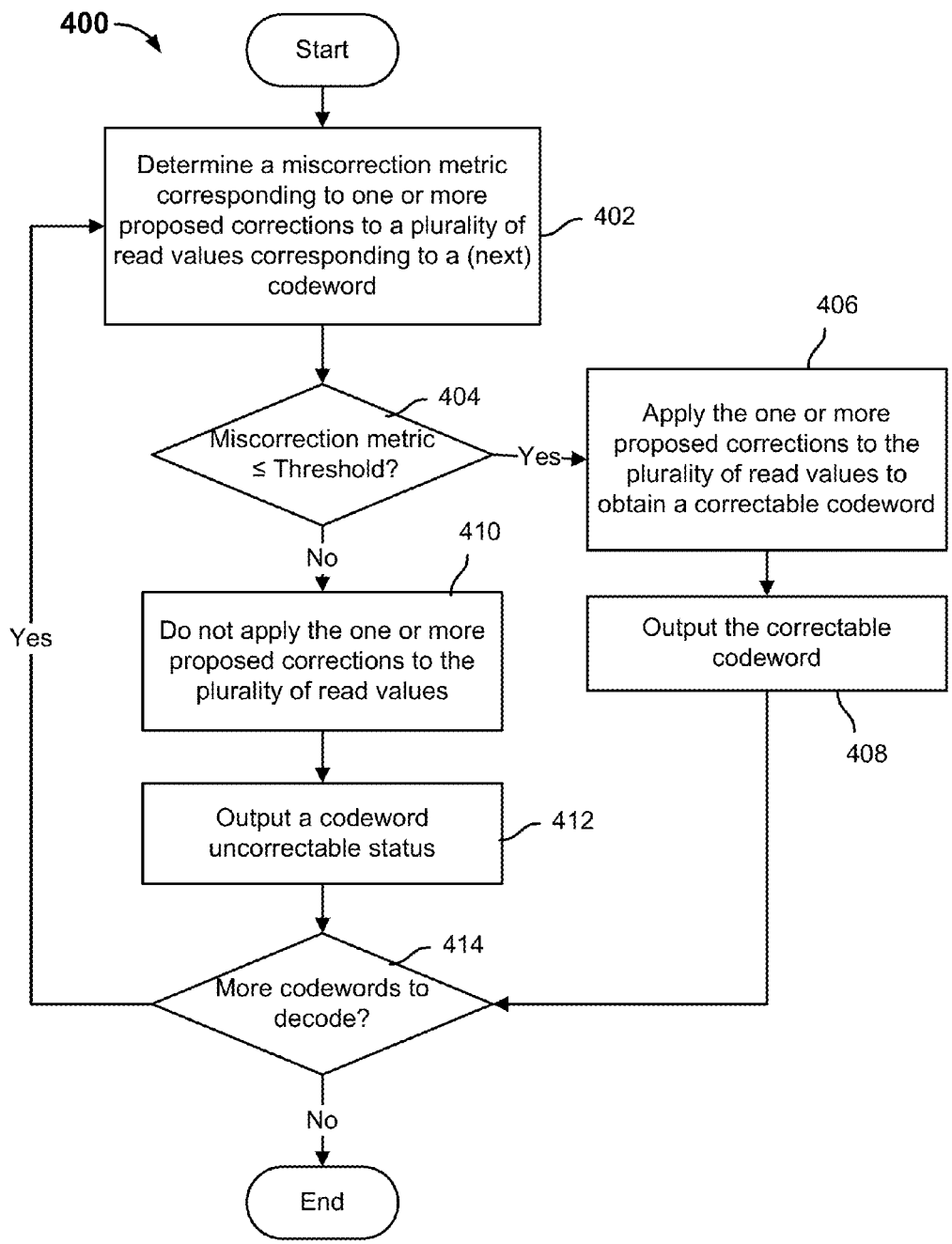
FIG. 4 is a flow diagram showing an embodiment of a process for miscorrection detection for error correcting codes using reliability information.

FIG. 4 is a flow diagram showing an embodiment of a process for miscorrection detection for error correcting codes using reliability information. In some embodiments, process 400 is performed by a read controller associated with a storage controller (e.g., a NAND Flash controller). In some embodiments, process 400 is performed by a semiconductor device, such as a field-programmable gate array (FPGA) or an application-specific integrated circuit (ASIC). In some embodiments, process 400 is implemented at a system such as system 200 of FIG. 2.

At 402, a miscorrection metric corresponding to one or more proposed corrections to a plurality of read values corresponding to a (next) codeword is determined. A decoder has already determined the plurality of read values (e.g., a set of hard decisions) to be correctable and has therefore output the one or more proposed corrections to corresponding locations of the set of hard decisions. The miscorrection metric can be determined based on the reliabilities corresponding to the locations of the set of hard decisions associated with the corrections proposed by the decoder. In some embodiments, the miscorrection metric is determined based at least in part on using a process such as process 300 of FIG. 3.

At 404, it is determined whether the miscorrection metric is less than or equal to a miscorrection threshold. For example, the value of the miscorrection threshold can be configured by a system administrator. For example, the value of the miscorrection threshold can be adjusted based on one or more events. In the event that the miscorrection metric is less than or equal to a miscorrection threshold, control is transferred to 406. Otherwise, in the event that the miscorrection metric is greater than a miscorrection threshold, control is transferred to 410.

At 406, the one or more proposed corrections are applied to the plurality of read values to obtain a correctable codeword. Because the miscorrection metric is less than or equal to the miscorrection threshold and it is therefore determined that applying corrections proposed by the decoder to the plurality of read values will likely not yield a miscorrection, the proposed corrections are applied to the plurality of read values to obtain a correctable codeword, which is output at 408.

At 410, the one or more proposed corrections are not applied to the plurality of read values. Because the miscorrection metric is greater than the miscorrection threshold and it is therefore determined that applying proposed corrections to the plurality of read values will likely yield a miscorrected correctable codeword, the proposed corrections are not applied to the plurality of read values and the codeword is determined to be uncorrectable. At 412, a codeword uncorrectable status is output.

At 414, it is determined whether there is at least one more codeword to decode. In the event that there is at least one more codeword to decode, control is returned to 402, where the miscorrection metric is determined for a plurality of read values associated with the next codeword to be decoded. Otherwise, in the event that there are no more codewords to decode, process 400 ends.

Assume the encoded codeword is $x=(x_0, x_1, \ldots, x_{n-1})$, $x_i=0$ or 1, where n is the codeword length of the code. The received vector can be represented as $r=(r_0, r_1, \ldots, r_{n-1})$. The decoder decodes received vector r to vector $\hat{x}$, which includes one more bit flips from received vector r. Now let's consider the probability that x is not equal to $\hat{x}$ given that the decoder decodes to $\hat{x}$: $P(x \neq \hat{x}|r)$. If we assume that the bits in the codeword are independent and break the probability down to each bit, the probability can be written as:

$$P(x \neq \hat{x}|r) \approx \Pi_{i=0 \text{ to } n-1} P(x_i \neq \hat{x}_i | r) \quad (1)$$

The probability will be dominated by those bits that x and $\hat{x}$ are not the same. If the probability is relatively large, then it is likely that the received vector is miscorrected. To be more practical, we derive a metric using log-likelihood ratio instead of the probability. Assume the reliability (e.g., the log-likelihood ratio (LLR)) of each bit of $\hat{x}$ can be written as $y=(y_0, y_1, \ldots, y_{n-1})$, where $y_i = \log(p(x_i=0|r_i)/p(x_i=1|r_i))$. The miscorrection metric ($\theta$) can be written as:

$$\theta = \Sigma_{i:x_i \neq \hat{x}_i} |y_i| \quad (2)$$

Since the transmitted codeword is not known at the receiver side, we use the hard decision vector z of the channel output, which is defined as:

$$z_i = \begin{cases} 0, & \text{if } y_i \geq 0 \\ 1, & \text{if } y_i < 0 \end{cases} \quad (3)$$

Thus, the metric in equation (2) can be broken down into three terms:

$$\theta = \Sigma_{i:z_i \neq \hat{x}_i} |y_i| + \Sigma_{i:z_i = \hat{x}_i, x_i \neq \hat{x}_i} |y_i| - \Sigma_{i:z_i \neq \hat{x}_i, x_i = \hat{x}_i} |y_i| \quad (4)$$

The first term is the summation of reliabilities for those bits flipped ($z_i \neq \hat{x}_i$, where $i=0, 1, \ldots, n-1$) during decoding. The second term includes those bits that are erroneous but the decoded codeword did not correct them ($z_i = \hat{x}_i$, $x_i \neq \hat{x}_i$, where $i=0, 1, \ldots, n-1$). This second term should be added to the first term. The third term includes those bits that are corrected by the decoded codeword, which are in error as well ($z_i \neq \hat{x}_i$, $x_i = \hat{x}_i$, where $i=0, 1, \ldots, n-1$). This third term should be subtracted from the first term. Usually the second and the third term are from those bits that have small reliabilities. So we can simplify the miscorrection metric ($\theta$) by ignoring the second and third terms, leaving only the first term of (4):

$$\theta \approx \Sigma_{i:z_i \neq \hat{x}_i, i=0, \ldots, n-1} |y_i| \quad (5)$$

This metric, which is referred to as the "miscorrection metric" in various embodiments described herein, can distinguish the miscorrected codeword and the correct codeword quite well. A miscorrection detector can use a miscorrection threshold (A) on the miscorrection metric ($\theta$) in (5) to detect miscorrection. For example, if $\theta \leq A$, the miscorrection detector can determine that the proposed bit flips should be applied to determine the codeword to be correctable. Otherwise, if $\theta > A$, the miscorrection detector can determine that the proposed bit flips should not be applied and instead determine that the codeword is uncorrectable. The miscorrection detector can be added to and/or combined with a decoder to lower the miscorrection rate.

In various embodiments, miscorrection threshold A can be chosen to filter out miscorrection more strictly or loosely, depending on the application. For example, in a TPC decoding scenario, miscorrection threshold A can be set tightly at the beginning of row/column decoding iterations, since the uncorrectable can be further corrected in later iterations, and then set looser close to the end of decoding, in order to avoid a stuck situation where the codeword is actually correctable but always reported uncorrectable by the miscorrection detector.

Figure 5:
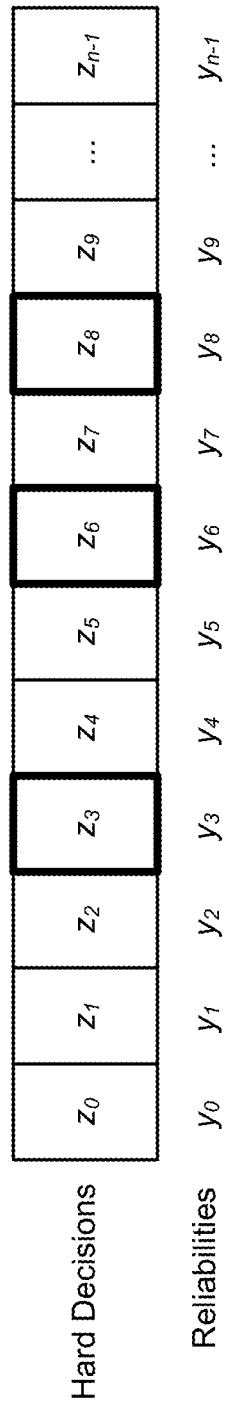
FIG. 5 shows a set of hard decisions and a corresponding set of reliabilities associated with a codeword.

FIG. 5 shows a set of hard decisions and a corresponding set of reliabilities associated with a codeword. In the example, the codeword was encoded using BCH code with parameter T=3, which indicates that the corresponding decoder can propose up to three corrections (e.g., bit flips) to set of hard decisions z associated with the codeword. In the example, the codeword is of length n and the bits of set of hard decisions z are associated with locations $i=0, 1, \ldots, n-1$. Each bit in set of hard decisions z is associated with a corresponding reliability in set of reliabilities y. For example, hard decision $z_0$ corresponds to reliability $y_0$.

For example, a hard decision error correction decoder (a decoder that uses only the hard decisions to decode) can receive as an input set of hard decisions z shown in FIG. 5 and output proposed bit flips to z at locations i=3, 6, and 8 (such locations in set of hard decisions z are denoted by a thicker border in the diagram). Then, a miscorrection detector can implement process 300 of FIG. 3 above to determine the miscorrection metric based on the reliabilities corresponding to the bit flips proposed by the hard decision error correction decoder. In this example, the reliabilities corresponding to the proposed bit flips at $z_3$, $z_6$, and $z_8$ are respectively, $y_3$, $y_6$, and $y_8$. For example, the miscorrection detector can specifically implement process 400 of FIG. 4 using the miscorrection metric formula ($\theta \approx \Sigma_{i:z_i \neq \hat{x}_i, i=0, \ldots, n-1} |y_i|$) of (5) above to determine $\theta = |y_3| + |y_6| + |y_8|$. In some embodiments, to determine whether the proposed bit flips at $z_3$, $z_6$, and $z_8$ should be applied to obtain a correctable codeword, the miscorrection detector is configured to compare θ to miscorrection threshold A. If θ≤A, then the proposed bit flips are permitted and a correctable codeword is output. But if θ>A, then the proposed bit flips are not permitted and an uncorrectable status is output.

Figure 6:
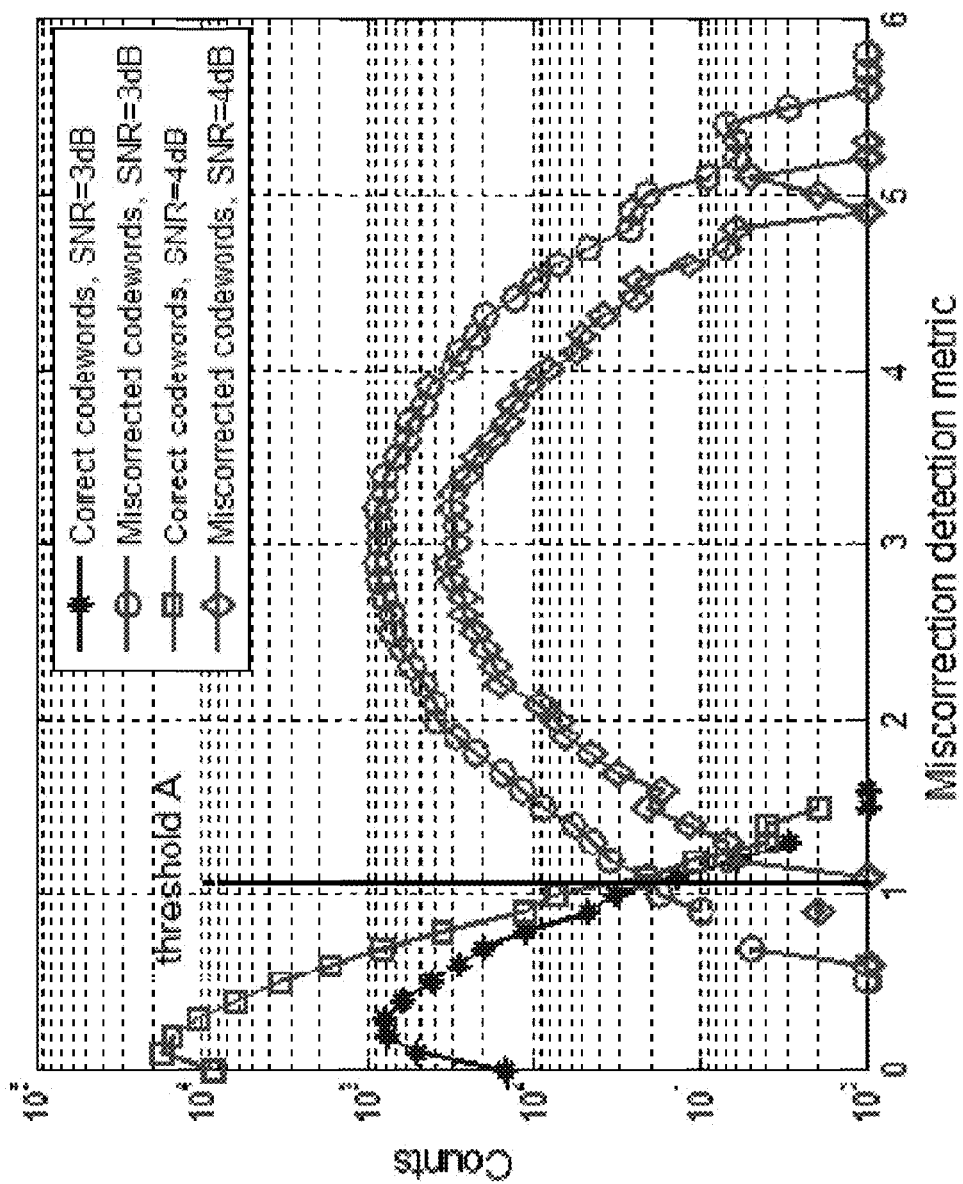
FIG. 6 is an example histogram of the miscorrection metric for correct correction and miscorrection in an AWGN channel by a hard decision BCH decoder, for a BCH code of T=3, n=1023.

FIG. 6 is an example histogram of the miscorrection metric for correct correction and miscorrection in an AWGN channel by a hard decision BCH decoder, for a BCH code of T=3, n=1023. FIG. 6 shows an example of a plot of the histogram of the miscorrection metric in equation (5) given the codeword is correct and miscorrected, for a BCH code which can correct up to three errors in 1023 bits. The channel is an AWGN channel with a reliability for each bit. The BCH decoder is a standard hard decision decoder, which uses only the hard decisions from the channel to decode. Two different SNRs, SNR=3 dB and SNR=4 dB, are included. We can see that the optimum miscorrection threshold A moves only a little bit for different SNRs. However, the optimum value for miscorrection threshold A can be higher for a higher SNR and lower for a lower SNR. As shown in the histogram, the desired value of miscorrection threshold A can be selected to be lower than the corresponding miscorrection metrics of the large majority (or a specified proportion) of the simulated miscorrected codewords. As such, most miscorrected codewords can be avoided from being output by selecting a desirable value for miscorrection threshold A.

In some embodiments, the miscorrection metric can be used with hard decision decoders as well as soft decision decoders. A soft decision decoder can also be used to generate proposed corrections to a set of hard decisions. Unlike a hard decision decoder that uses only the hard decisions from the channel to decode, a soft decision decoder uses both the hard decisions and the corresponding soft decisions (reliabilities) to decode. In some embodiments, a soft decision decoder can be used when decoding cannot be successfully performed with a hard decision decoder. An example of a soft decision decoder is the Chase decoder. Chase decoding can increase the chance that a hard decision decoder can receive an input bit sequence that is possible to decode to the correct codeword. An example of determining the miscorrection metric with a soft decision decoder, a Chase decoder, is described below.

Chase Decoding Example

Figure 7:
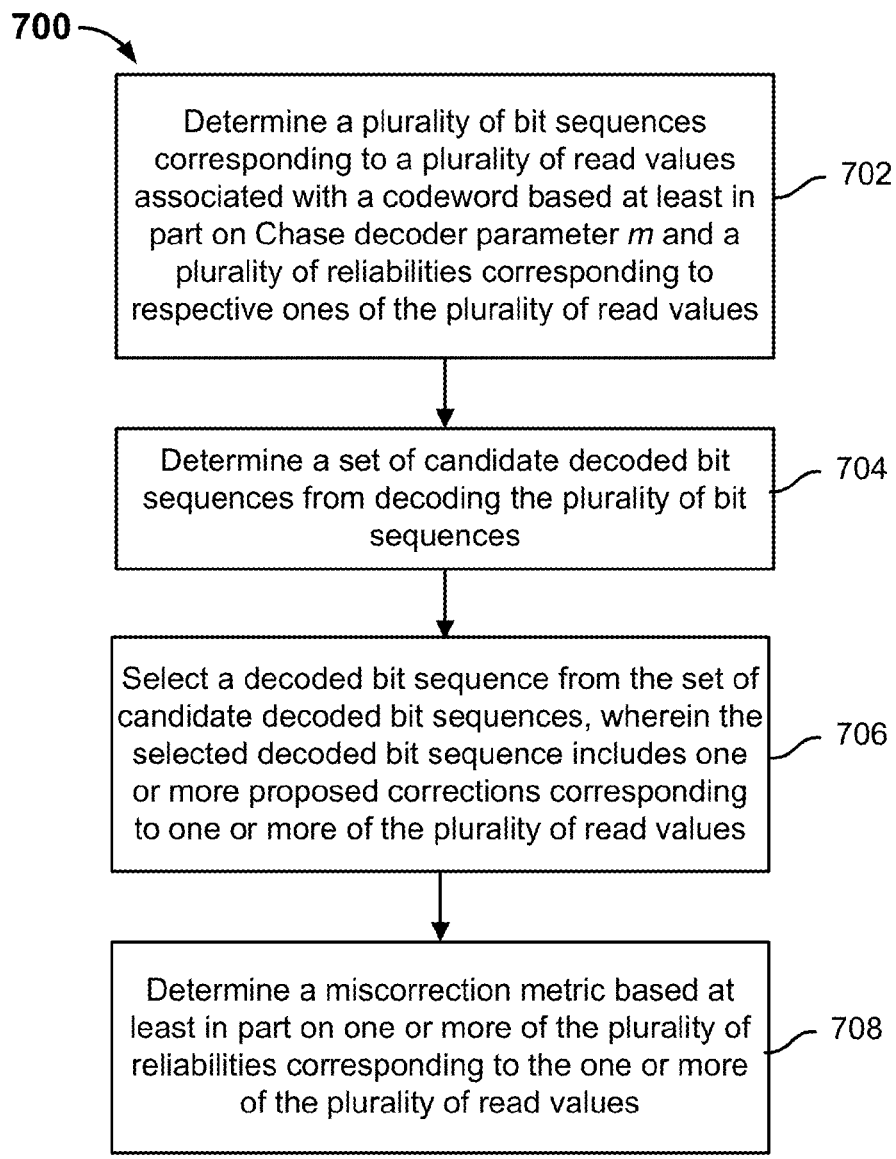
FIG. 7 is a flow diagram that describes an example process of decoding using a soft decision BCH decoder.

FIG. 7 is a flow diagram that describes an example process of decoding using a soft decision BCH decoder. In the example, process 700 is implemented by a Chase-m decoder (an example of which is described in further detail with FIG. 8 below). The Chase-m decoder includes at least a flipping component and a hard decision error correction decoder component. In some embodiments, process 700 is performed by a read controller associated with a storage controller (e.g., a NAND Flash controller). In some embodiments, process 700 is performed by a semiconductor device, such as a field-programmable gate array (FPGA) or an application-specific integrated circuit (ASIC). In some embodiments, process 700 is implemented at a system such as system 200 of FIG. 2.

At 702, a plurality of bit sequences corresponding to a plurality of read values is determined based at least in part on Chase decoder parameter m and a plurality of reliabilities corresponding to respective ones of the plurality of read values associated with a codeword. In some embodiments, the Chase decoder receives as inputs the plurality of read values (e.g., a set of hard decisions) and a corresponding plurality of reliabilities (a reliability corresponding to each one of the set of hard decisions). The parameter m can be selected to be any integer. In Chase decoding of BCH code, the set of reliabilities are used by a flipping component of the Chase decoder to identify the m locations of most unreliable bits among the input set of hard decisions. Then, all possible bit flips of the m most unreliable bits of the input set of hard decisions are made by the flipping component of the Chase decoder to form $2^m$ of bit sequences. Each bit sequence comprises the input set of hard decisions with the value(s) at zero and more of the identified m bit locations flipped.

At 704, a set of candidate decoded bit sequences is determined from decoding the plurality of bit sequences. The candidate set of bit sequences can be represented as $K = \{k^{(j)}, j=0, 1, \ldots, 2^m - 1\}$. Each of the set of $2^m$ bit sequences is fed into a hard decision error correction decoder component of the Chase decoder. The hard decision error correction decoder component of the Chase decoder then attempts to decode each of the $2^m$ bit sequences. For each decoding try, there are two possibilities: if the decoder deems the input bit sequence uncorrectable, then that particular decoding attempt is discarded. If the decoder deems the input bit sequence correctable, then the decoder will propose one or more bit flips to the input bit sequence. Assuming that the hard decision error correction decoder component of the Chase decoder is a BCH decoder with T=3, then the decoder can propose up to T locations of the correctable input bit sequence that need to be flipped. Note that the (e.g., T) locations of the bit flips indicated by the decoder can be anywhere in the codeword, not just in the m most unreliable locations. Set $X = \{\hat{x}^{(j)}, j=0, 1, \ldots, l, \text{ where } 1 \leq 2^m\}$ represents the set of decoded bit sequences output by the hard decision error correction decoder component of the Chase decoder. Because not every bit sequence may be decodable, the number of decoded bit sequences l may be fewer than the total number of bit sequences, $2^m$. Furthermore, at least some of the decoded bit sequences of set X are not distinct since multiple bit sequences may decode to the same codeword. The decoded bit sequences of set X may be thought of as "candidate codewords" or "candidate decoded bit sequences" from which one is to be selected and output by the Chase decoder.

At 706, a decoded bit sequence is selected from the set of candidate decoded bit sequences, wherein the selected decoded bit sequence includes one or more proposed corrections corresponding to one or more of the plurality of read values. If the decoded set X is empty, the codeword is uncorrectable. If X is not empty, one decoded bit sequence can be selected from the set of candidate decoded bit sequences to output from the Chase decoder and to use to determine the miscorrection metric. For example, the decoded bit sequence is selected from set X such that it has the smallest Euclidean distance from the received vector. In some embodiments, the "received vector" comprises the set of hard decisions that was input to the Chase decoder. In another example, the decoded bit sequence with the highest reliability is selected from set X.

Note that m most unreliable locations of the input set of hard decisions were flipped by the flipping component of the Chase decoder. The hard decision error correction decoder component of the Chase decoder then flips up to T more locations of the input set of hard decisions. Thus, each of the candidate decoded bit sequences of set X (including the selected decoded bit sequence) can differ from the set of hard decisions up to (T+m) locations. The up to (T+m) locations in which bits differ between the input set of hard decisions and the selected decoded bit sequence form the set of proposed corrections output by the Chase decoder to the input set of hard decisions.

At 708, a miscorrection metric is determined based at least in part on one or more of the plurality of reliabilities corresponding to the one or more of the plurality of read values. The reliability corresponding to each of the up to (T+m) of proposed corrections in which a bit value differs between the input set of hard decisions and the selected decoded bit sequence is identified. Then, all the identified reliabilities are combined to determine the miscorrection metric (e.g., θ). Put another way, the miscorrection metric is computed over all the differences between the input set of hard decisions and the selected decoded bit sequence, so the computation for the miscorrection metric can combine reliabilities corresponding to the up to (T+m) proposed corrections to the set of hard decisions.

In various embodiments, 708 can be implemented by a process such as process 300 of FIG. 3. The determined miscorrection metric can then be used to determine whether to output the decoded bit sequence or to output an uncorrectable status and no decoded codeword to avoid a potential miscorrection. In some embodiments, such miscorrection detection can be implemented using a process such as process 400 of FIG. 4.

The correction capability of a Chase decoder increases with large values of m, but the complexity of the Chase decoder also increases exponentially with higher values of m. Thus, in some embodiments, it is desirable to have a smaller value of m. Chase decoding can exacerbate the miscorrection problem because, by flipping up to m of the received bits, errors can actually be added. Thus, whereas a normal miscorrection (e.g., via a BCH hard decision decoder) can introduce (through miscorrection) at most T bit-errors into the decoding matrix, Chase-m can add up to (T+m) errors.

Figure 8:
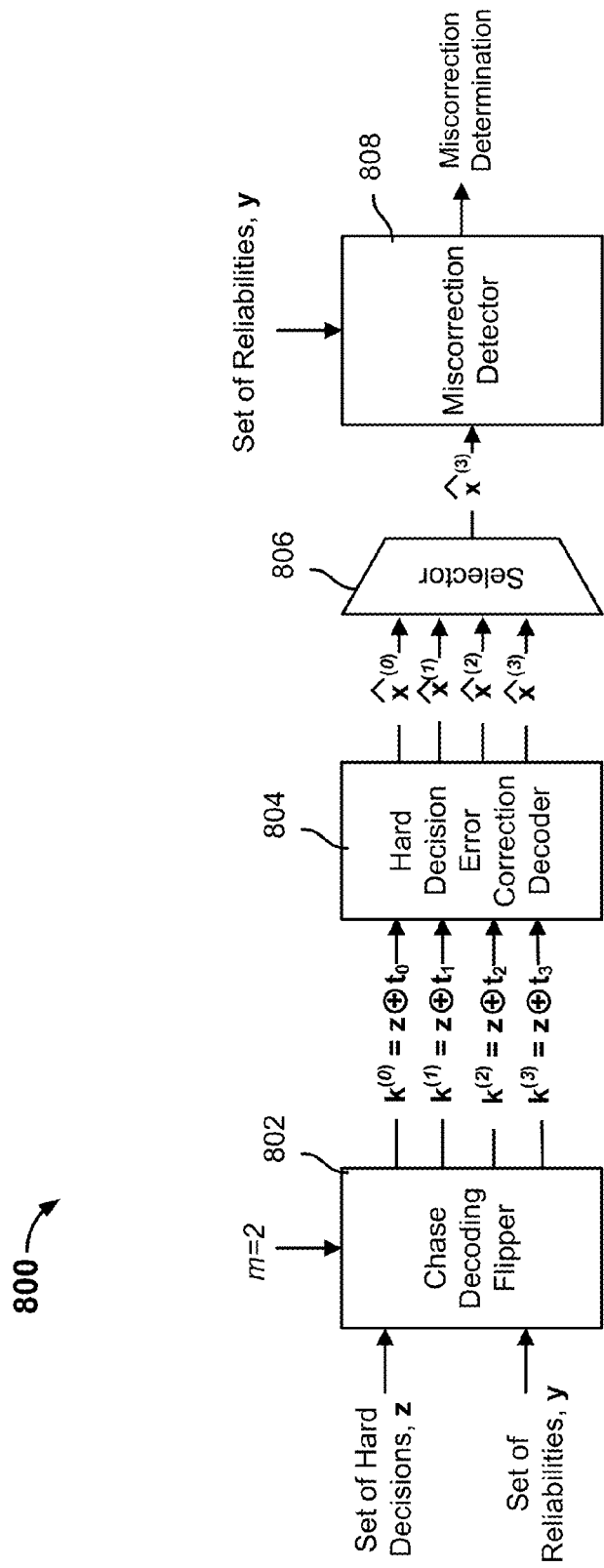
FIG. 8 is a diagram showing a Chase-m decoder and a miscorrection detection system.

FIG. 8 is a diagram showing a Chase-m decoder and a miscorrection detection system. In the example, system 800 includes the Chase-m decoder, which comprises at least Chase decoding flipper 802, hard decision error correction decoder 804, and selector 806. System 800 also includes miscorrection detector 808. In some embodiments, error correction decoder 202 of system 200 of FIG. 2 can be implemented using Chase decoding flipper 802, hard decision error correction decoder 804, and selector 806. In some embodiments, miscorrection detector 204 of system 200 of FIG. 2 can be implemented using miscorrection detector 808.

Chase decoding flipper 802 is configured to identify the m most unreliable bits of set of hard decisions z based on set of reliabilities y, where each of set of reliabilities y corresponds to the probability of a corresponding one of set of hard decisions z. In the example, m is selected to be two. $2^{m=2}$ (=4) bit sequences $k^{(0)}$, $k^{(1)}$, $k^{(2)}$, and $k^{(3)}$ are generated by making different possibilities of bit flips at the identified m=2 locations of set of hard decisions z. In the example, each of bit sequences $k^{(0)}$, $k^{(1)}$, $k^{(2)}$, and $k^{(3)}$ is constructed by combining (e.g., XORing) set of hard decisions z with a corresponding t vector ($t^{(0)}$, $t^{(1)}$, $t^{(2)}$, and $t^{(3)}$) that includes different possibilities of "0"s and "1"s at the identified m=2 locations and "0"s in all other locations. Constructed bit sequences $k^{(0)}$, $k^{(1)}$, $k^{(2)}$, and $k^{(3)}$ are each input into hard decision error correction decoder 804. Hard decision error correction decoder 804 is configured to determine which of bit sequences $k^{(0)}$, $k^{(1)}$, $k^{(2)}$, and $k^{(3)}$ can be decoded. In the example, assume that each of bit sequences $k^{(0)}$, $k^{(1)}$, $k^{(2)}$, and $k^{(3)}$ can be decoded and as such, hard decision error correction decoder 804 outputs respective candidate decoded bit sequences $\hat{x}^{(0)}$, $\hat{x}^{(1)}$, $\hat{x}^{(2)}$, and $\hat{x}^{(3)}$. In the example, hard decision error correction decoder 804 comprises a BCH decoder with parameter T. Each of candidate decoded bit sequences $\hat{x}^{(0)}$, $\hat{x}^{(1)}$, $\hat{x}^{(2)}$, and $\hat{x}^{(3)}$ includes up to (T+m) net differences from set of hard decisions z (due to the up to m number of bit flips from Chase decoding flipper 802 and the up to T number of bit flips from hard decision error correction decoder 804). Selector 806 is configured to select one of candidate decoded bit sequences $\hat{x}^{(0)}$, $\hat{x}^{(1)}$, $\hat{x}^{(2)}$, and $\hat{x}^{(3)}$ based on selection criteria associated with the Chase decoder. For example, the selection criteria can be configured to select the decoded bit sequence with the smallest Euclidean distance to set of hard decisions z or the selection criteria can be configured to select the decoded bit sequence with the highest reliability.

In the example, decoded bit sequence $\hat{x}^{(3)}$ is selected by selector 806 as the output of the Chase decoder. Selected decoded bit sequence $\hat{x}^{(3)}$ is then input into miscorrection detector 808. Set of reliabilities y is also input into miscorrection detector 808. In various embodiments, miscorrection detector 808 is configured to identify the up to (T+m) locations in which bits differ between set of hard decisions z and the selected decoded bit sequence $\hat{x}^{(3)}$. These up to (T+m) locations in which bits differ comprise the set of corrections proposed by the Chase decoder to set of hard decisions z. Miscorrection detector 808 is configured to compute a miscorrection metric based on the reliabilities of set of reliabilities y that correspond to the identified up to (T+m) net bit flips proposed by the Chase decoder to set of hard decisions z. Miscorrection detector 808 is configured to determine whether the up to (T+m) net bit flips proposed by the Chase decoder to set of hard decisions z should be applied/committed based on the miscorrection metric. In some embodiments, miscorrection detector 808 is configured to compare the miscorrection metric to a miscorrection threshold to determine whether the up to (T+m) bit flips proposed by the Chase decoder to set of hard decisions z should be applied/committed based on the miscorrection metric. In some embodiments, if miscorrection detector 808 determines that the miscorrection metric is less than or equal to the miscorrection threshold, then the bit flips proposed by the Chase decoder are allowed to be committed to set of hard decisions z and selected decoded bit sequence $\hat{x}^{(3)}$ is caused to be output as a correctable codeword. Otherwise, if miscorrection detector 808 determines that the miscorrection metric is greater than the miscorrection threshold, then the proposed corrections are prevented from being committed to set of hard decisions z and an uncorrectable status of the codeword is caused to be output. In some embodiments, miscorrection detector 808 is configured to perform at least one of process 300 of FIG. 3 and process 400 of FIG. 4.

Figure 9:
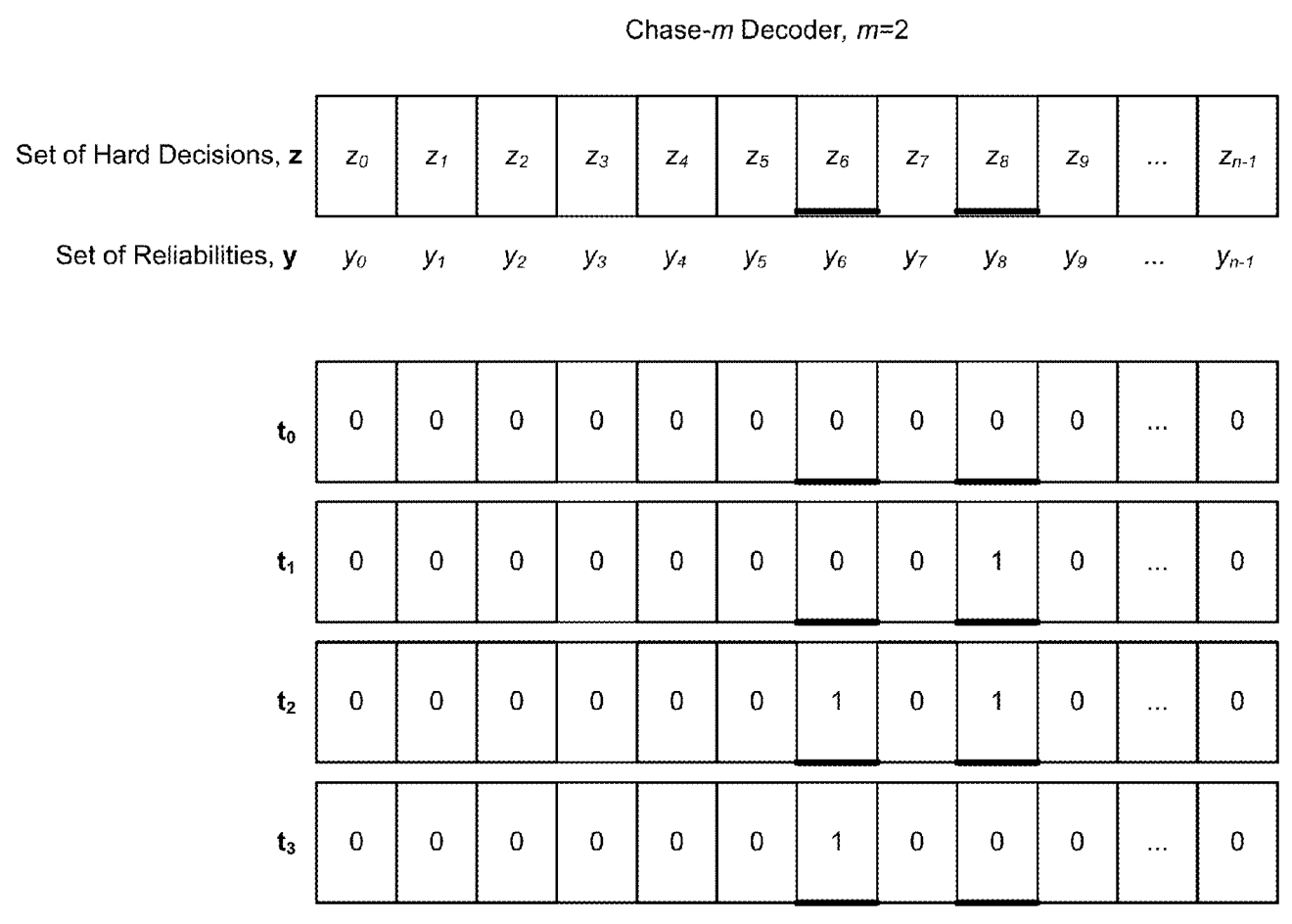

FIG. 9 shows a set of hard decisions and a corresponding set of reliabilities associated with a codeword and the identified m bits in Chase decoding. In the example, the codeword is of length n and the bits of set of hard decisions z are associated with locations i=0, 1, . . . , n−1. Each bit in set of hard decisions z is associated with a corresponding reliability in set of reliabilities y. For example, hard decision $z_0$ corresponds to reliability $y_0$. In the example, m=2 and the two most unreliable bits of set of hard decisions z are associated with locations i=6 and 8 (locations 6 and 8 are each denoted in set of hard decisions z with a thick underline). Referring back to the example of FIG. 8, to generate $2^{m-2}$ (=4) bit sequences $k^{(0)}$, $k^{(1)}$, $k^{(2)}$, and $k^{(3)}$, vectors $t^{(0)}$, $t^{(1)}$, $t^{(2)}$, and $t^{(3)}$ are constructed. As shown in the example, each of vectors $t^{(0)}$, $t^{(1)}$, $t^{(2)}$, and $t^{(3)}$ includes different possibilities of "0" and "1" at locations i=6 and 8 and "0"s at all other locations besides locations i=6 and 8. Therefore, bit sequences $k^{(0)}$, $k^{(1)}$, $k^{(2)}$, and $k^{(3)}$ can be generated by combining (e.g., XORing) set of hard decisions z with each of respective vectors $t^{(0)}$, $t^{(1)}$, $t^{(2)}$, and $t^{(3)}$. As a result, each of bit sequences $k^{(0)}$, $k^{(1)}$, $k^{(2)}$, and $k^{(3)}$ includes a different possibility of bit flips at locations i=6 and 8.

Figure 10:
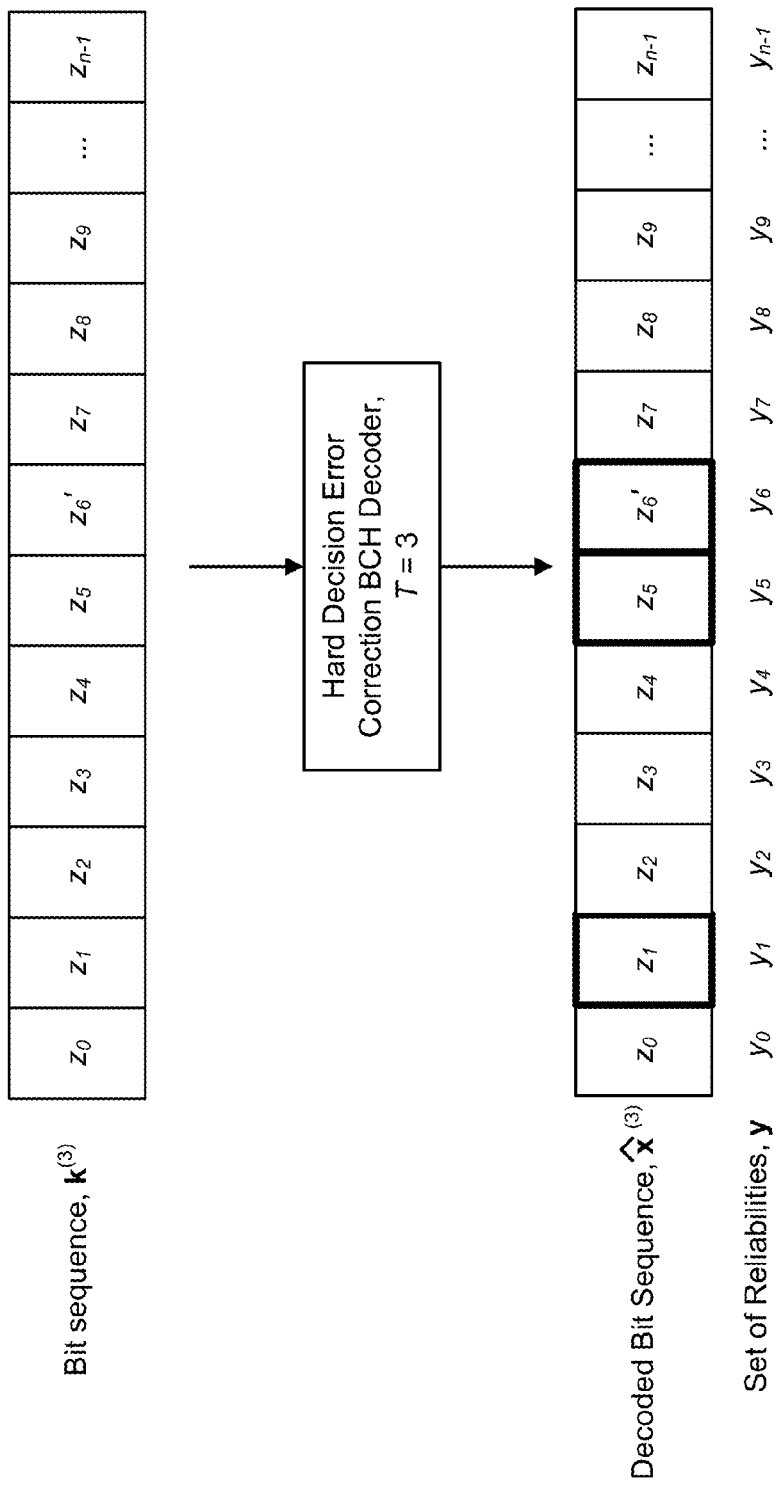
FIG. 10 shows a bit sequence that is input into a hard decision error correction BCH decoder (T=3) of a Chase decoder and the decoded bit sequence that is output by the Chase decoder.

FIG. 10 shows a bit sequence that is input into a hard decision error correction BCH decoder (T=3) of a Chase decoder and the decoded bit sequence that is output by the Chase decoder. In the example, the codeword was encoded using BCH code with parameter T=3, which indicates that the hard decision error correction decoder component of the Chase decoder can propose up to three corrections (e.g., bit flips) to each input bit sequence. Bit sequence $k^{(3)}$ is generated by the flipping component of the Chase decoder combining (e.g., XORing) set of hard decisions z and vector $t^{(3)}$ from FIG. 9. As such, bit sequence $k^{(3)}$ comprises set of hard decisions z with a bit flip at location i=6 (the flipped bit is denoted in the diagram as $z_6'$). The output by the hard decision error correction BCH decoder (T=3) is decoded bit sequence $\hat{x}^{(3)}$ of the example of FIG. 8. Decoded bit sequence $\hat{x}^{(3)}$ comprises bit sequence $k^{(3)}$ with bit flips made by the hard decision error correction BCH decoder to locations i=1, 5, and 6 (the locations of such flipped bits are denoted in the diagram by thicker borders). Continuing the example of FIG. 8, decoded bit sequence $\hat{x}^{(3)}$ is selected among a set of candidate decoded bit sequences to be output by the Chase decoder and to use to determine the miscorrection metric. A miscorrection detector (e.g., miscorrection detector 808 of FIG. 8) can implement process 300 of FIG. 3 above to determine the miscorrection metric based on the reliabilities corresponding to the net bit flips made to set of hard decisions z by processing set of hard decisions z using the flipping component of the Chase decoder and the hard decision error correction decoder component of the Chase decoder to output decoded bit sequence $\hat{x}^{(3)}$. In this example, while $z_6$ of set of hard decisions z was flipped by the flipping component of the Chase decoder into $z_6'$, $z_6'$ was flipped back by the hard decision error correction decoder component of the Chase decoder into $z_6$. As such, no net bit flip is found at location i=6 of set of hard decisions z and therefore reliability $y_6$ corresponding to $z_6$ will not be used to determine the miscorrection metric. However, net bit flips to set of hard decisions z can be found at locations i=1 and 5 and so the reliabilities corresponding to locations i=1 and 5 are used to determined the miscorrection metric. The reliabilities corresponding to the bit flips at $z_1$ and $z_5$ are respectively, $y_1$ and $y_5$. For example, the miscorrection detector (e.g., miscorrection detector 808 of FIG. 8) can specifically implement process 400 of FIG. 4 using the miscorrection metric formula $(\theta \approx \Sigma_{i:z_i \neq \hat{x}_i, i=0, \ldots, n-1} |y_i|)$ of (5) above to determine $\theta = |y_1| + |y_5|$. In some embodiments, to determine whether the net bit flips to $z_1$ and $z_5$ should be allowed to obtain a correctable codeword, the miscorrection detector (e.g., miscorrection detector 808 of FIG. 8) is configured to compare $\theta$ to miscorrection threshold A. If $\theta \leq A$, then the bit flips are permitted and decoded bit sequence $\hat{x}^{(3)}$ is output. But if $\theta > A$, then the bit flips are not permitted and an uncorrectable status is output.

Figure 11:
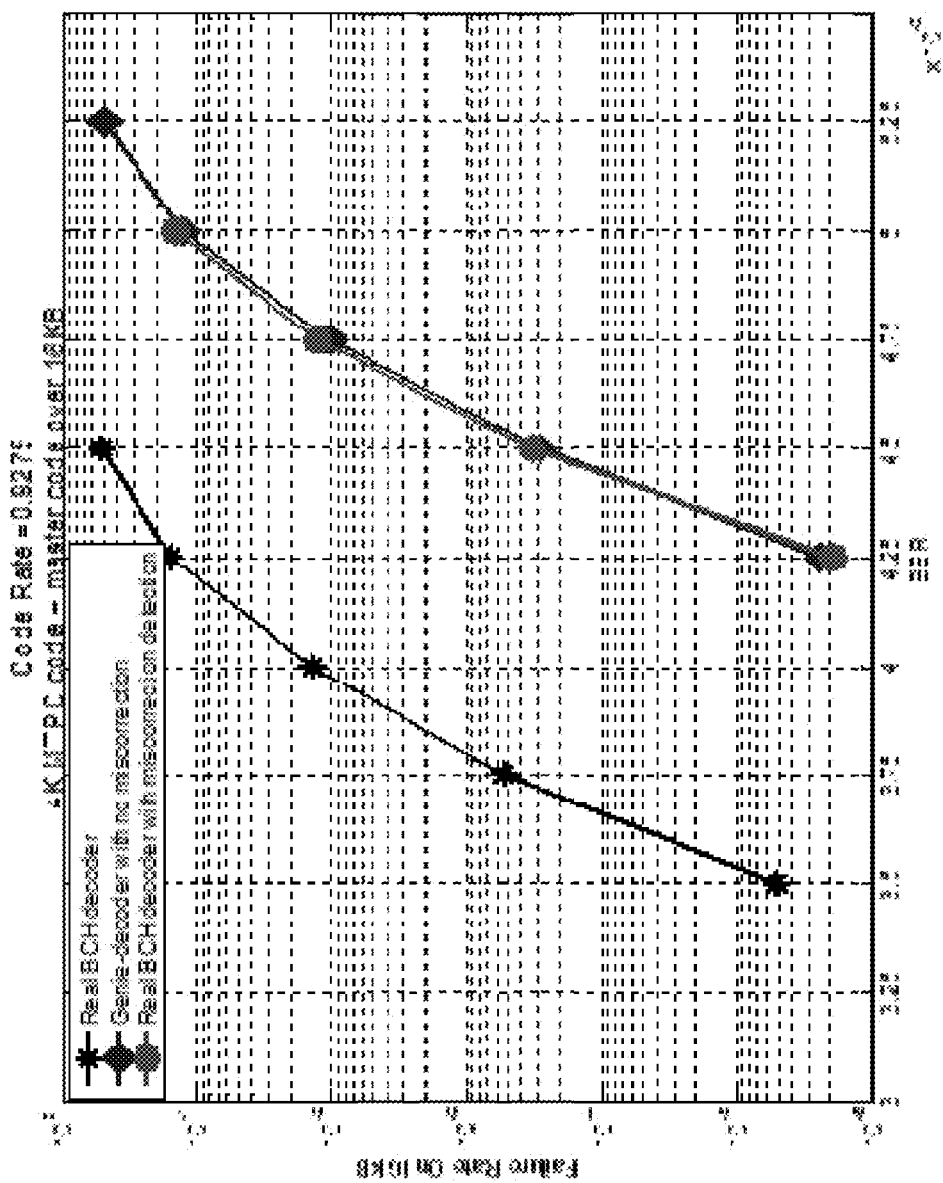
FIG. 11 shows an example performance curve with miscorrection detection and as shown it nearly overlaps the genie-decoding curve.

FIG. 11 shows an example performance curve with miscorrection detection and as shown it nearly overlaps the genie-decoding curve. As can be seen from the example, as a result of the addition of miscorrection detection (e.g., if the miscorrection detector judges a codeword to be miscorrected, that codeword will not be corrected) in the decoding process, the decoding nearly performance matches that of the genie decoder.

Miscorrection detection can be used to improve the performance of decoding. Miscorrection detection can be combined with either hard decision decoding or soft decision decoding. In various embodiments, miscorrection detection is performed based on thresholding. Miscorrection detection can be flexible as the miscorrection threshold can be selected to filter out more strictly or loosely and can also be adjusted over time or in response to certain events.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
    an error correction decoder configured to:
        generate one or more proposed corrections corresponding to one or more of a plurality of read values, wherein the plurality of read values corresponds to a codeword; and
    a miscorrection detector configured to:
        receive a plurality of reliabilities, one or more of the plurality of reliabilities corresponding to the one or more of the plurality of read values;
        receive the one or more proposed corrections corresponding to the one or more of the plurality of read values; and
        determine a miscorrection metric based at least in part on the one or more of the plurality of reliabilities corresponding to the one or more of the plurality of read values.

2. The system of claim 1, wherein the system includes a semiconductor device, including one or more of the following: a field-programmable gate array (FPGA) or an application-specific integrated circuit (ASIC).

3. The system of claim 1, wherein the plurality of read values comprise a plurality of hard decisions.

4. The system of claim 1, wherein the one or more proposed corrections comprises one or more proposed bit flips corresponding to one or more locations within the plurality of read values.

5. The system of claim 1, wherein at least one of the plurality of reliabilities comprises a log-likelihood ratio (LLR).

6. The system of claim 1, wherein determining the miscorrection metric based at least in part on the one or more of the plurality of reliabilities corresponding to the one or more of the plurality of read values comprises combining absolute values of the one or more of the plurality of reliabilities.

7. The system of claim 1, wherein the miscorrection detector is further configured to:
    compare the miscorrection metric to a miscorrection threshold, wherein:
        in the event that the miscorrection metric is less than or equal to the miscorrection threshold, apply the one or more proposed corrections to the plurality of read values to obtain a correctable codeword and output the correctable codeword; and
        in the event that the miscorrection metric is greater than the miscorrection threshold, do not apply the one or more proposed corrections to the plurality of read values and output a codeword uncorrectable status.

8. The system of claim 7, wherein the miscorrection threshold is adjustable in response to one or more of the following: a change in decoding iteration and a change in signal-to-noise (SNR).

9. The system of claim 1, wherein the codeword is encoded using a Turbo Product Code (TPC).

10. The system of claim 1, wherein the error correction decoder is further configured to:
   determine a plurality of bit sequences corresponding to the plurality of read values based at least in part on Chase decoder parameter m and the plurality of reliabilities;
   determine a set of candidate decoded bit sequences from decoding the plurality of bit sequences; and
   select a decoded bit sequence from the set of candidate decoded bit sequences, wherein the selected decoded bit sequence includes the one or more proposed corrections.

11. The system of claim 10, wherein the selected decoded bit sequence is selected from the set of candidate decoded bit sequences based at least in part on a reliability that the selected decoded bit sequence corresponds to a correct codeword.

12. The system of claim 10, wherein the selected decoded bit sequence is selected from the set of candidate decoded bit sequences based at least in part on a Euclidean distance between the selected decoded bit sequence and the plurality of read values.

13. The system of claim 10, wherein the one or more proposed corrections comprise one or more bit flips between the plurality of read values and the selected decoded bit sequence.

14. The system of claim 10, wherein the one or more proposed corrections include one or more net bit flips to the plurality of read values determined by bit flipping up to m most unreliable locations of the plurality of read values using a flipping component of the error correction decoder and then bit flipping up to T locations using a hard decision error correction decoder component of the error correction decoder.

15. A method, comprising:
   receiving a plurality of reliabilities, one or more of the plurality of reliabilities corresponding to one or more of a plurality of read values;
   receiving one or more proposed corrections corresponding to the one or more of the plurality of read values; and
   determining a miscorrection metric based at least in part on the one or more of the plurality of reliabilities corresponding to the one or more of the plurality of read values.

16. The method of claim 15, wherein determining the miscorrection metric based at least in part on the one or more of the plurality of reliabilities corresponding to the one or more of the plurality of read values comprises combining absolute values of the one or more of the plurality of reliabilities.

17. The method of claim 15, further comprising:
   comparing the miscorrection metric to a miscorrection threshold, wherein:
      in the event that the miscorrection metric is less than or equal to the miscorrection threshold, applying the one or more proposed corrections to the plurality of read values to obtain a correctable codeword and outputting the correctable codeword; and
      in the event that the miscorrection metric is greater than the miscorrection threshold, not applying the one or more proposed corrections to the plurality of read values and outputting a codeword uncorrectable status.

18. The method of claim 17, wherein the miscorrection threshold is adjustable in response to one or more of the following: a change in decoding iteration and a change in signal-to-noise (SNR).

19. The method of claim 15, further comprising:
   determining a plurality of bit sequences corresponding to the plurality of read values based at least in part on Chase decoder parameter m and the plurality of reliabilities;
   determining a set of candidate decoded bit sequences from decoding the plurality of bit sequences; and
   selecting a decoded bit sequence from the set of candidate decoded bit sequences, wherein the selected decoded bit sequence includes the one or more proposed corrections.

20. The method of claim 19, wherein the one or more proposed corrections comprise one or more bit flips between the plurality of read values and the selected decoded bit sequence.

21. The method of claim 19, wherein the one or more proposed corrections include one or more net bit flips to the plurality of read values determined by bit flipping up to m most unreliable locations of the plurality of read values and then bit flipping up to T locations of the plurality of read values.

* * * * *